(12) United States Patent
Nakata et al.

(10) Patent No.: US 8,247,867 B2
(45) Date of Patent: Aug. 21, 2012

(54) SEMICONDUCTOR DEVICE

(75) Inventors: Kazunari Nakata, Tokyo (JP); Atsushi Narazaki, Tokyo (JP); Shigeto Honda, Tokyo (JP); Kaoru Motonami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 83 days.

(21) Appl. No.: 12/836,922

(22) Filed: Jul. 15, 2010

(65) Prior Publication Data

US 2011/0089487 A1 Apr. 21, 2011

(30) Foreign Application Priority Data

Oct. 20, 2009 (JP) ................................. 2009-241266

(51) Int. Cl.
*H01L 29/78* (2006.01)
(52) U.S. Cl. .. 257/331; 257/332; 257/342; 257/E29.262
(58) Field of Classification Search .......... 257/330–334, 257/341, 342, E29.262, E29.268
See application file for complete search history.

(56) References Cited

U.S. PATENT DOCUMENTS

| 6,204,533 | B1 * | 3/2001 | Williams et al. | ............... 257/341 |
| 6,717,210 | B2 | 4/2004 | Takano et al. | |
| 6,867,083 | B2 * | 3/2005 | Imam et al. | ................... 438/212 |
| 6,984,864 | B2 | 1/2006 | Uno et al. | |
| 7,358,143 | B2 | 4/2008 | Uno et al. | |
| 7,521,759 | B2 * | 4/2009 | Sasaki | ........................... 257/340 |
| 7,812,409 | B2 * | 10/2010 | Hshieh | ........................... 257/401 |
| 2010/0308401 | A1 * | 12/2010 | Narazaki | ....................... 257/330 |

FOREIGN PATENT DOCUMENTS

| JP | 2002-50760 | 2/2002 |
| JP | 2004-55803 | 2/2004 |
| JP | 2004-95962 | 3/2004 |
| JP | 2008-124511 | 5/2008 |
| KR | 10-2005-0032753 | 4/2005 |

OTHER PUBLICATIONS

Office Action issued Mar. 29, 2012 in Korean Application No. 10-2010-0098603 (w/partial English translation).
Office Action issued May 8, 2012 in German Application No. 10 2010 042 691.1 (w/English translation).

* cited by examiner

*Primary Examiner* — Tuan N. Quach
(74) *Attorney, Agent, or Firm* — Oblon, Spivak, McClelland, Maier & Neustadt, L.L.P.

(57) ABSTRACT

A semiconductor device includes a base layer that has a first conductivity type, a source layer that is formed on the base layer and has a second conductivity type, and an insulating film that is formed on the source layer. The semiconductor device further includes a plurality of gate structures that penetrate the base layer, and a plurality of conductive parts that penetrate the insulating film and the source layer and electrically connect the source layer and the base layer to each other. The gate structures are formed in a stripe shape in plan view. Parts in which the conductive portion is connected to the base layer are formed in a stripe shape in plan view, and are formed between the gate structures. Further, a dimension of the part in which the source layer and the base layer are in contact with each other between the gate structure and the conductive portion is 0.36 μm or more.

9 Claims, 8 Drawing Sheets

F I G. 1
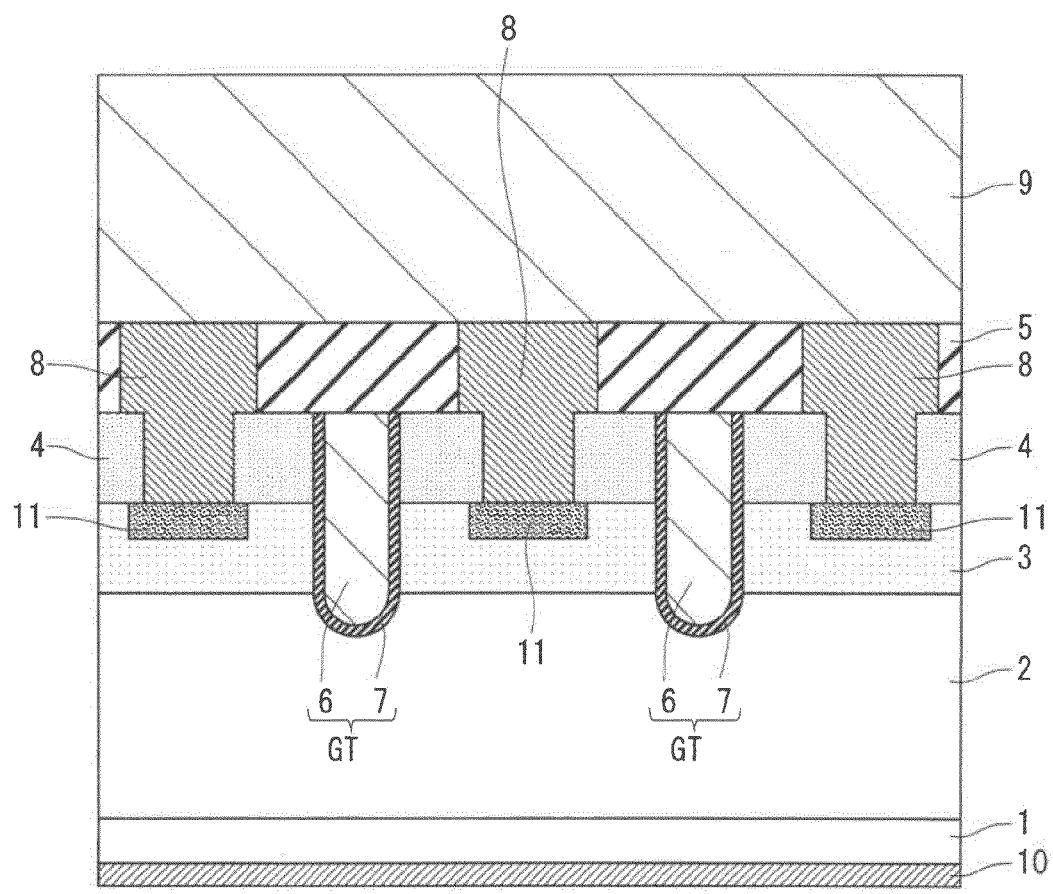

F I G . 3
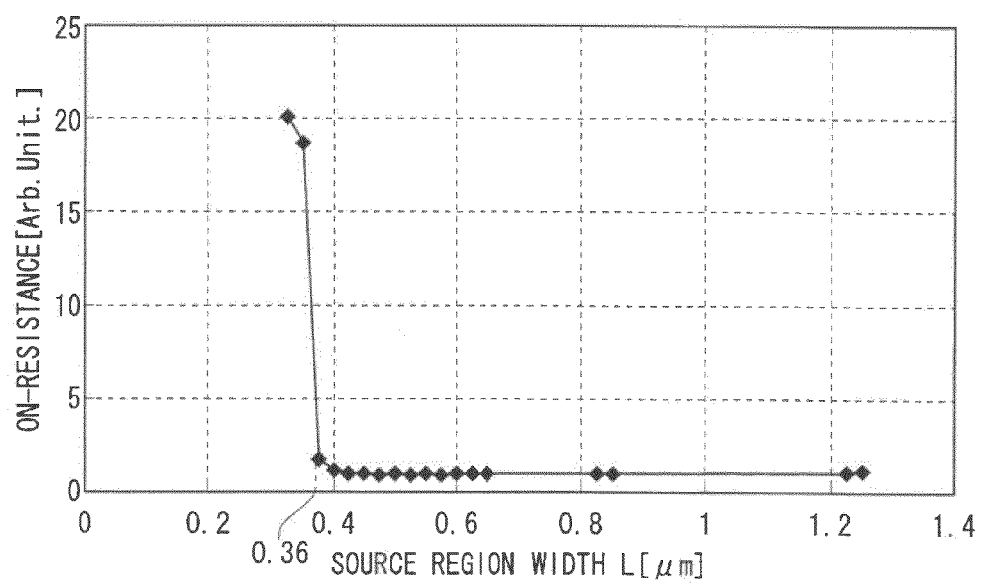

F I G. 5
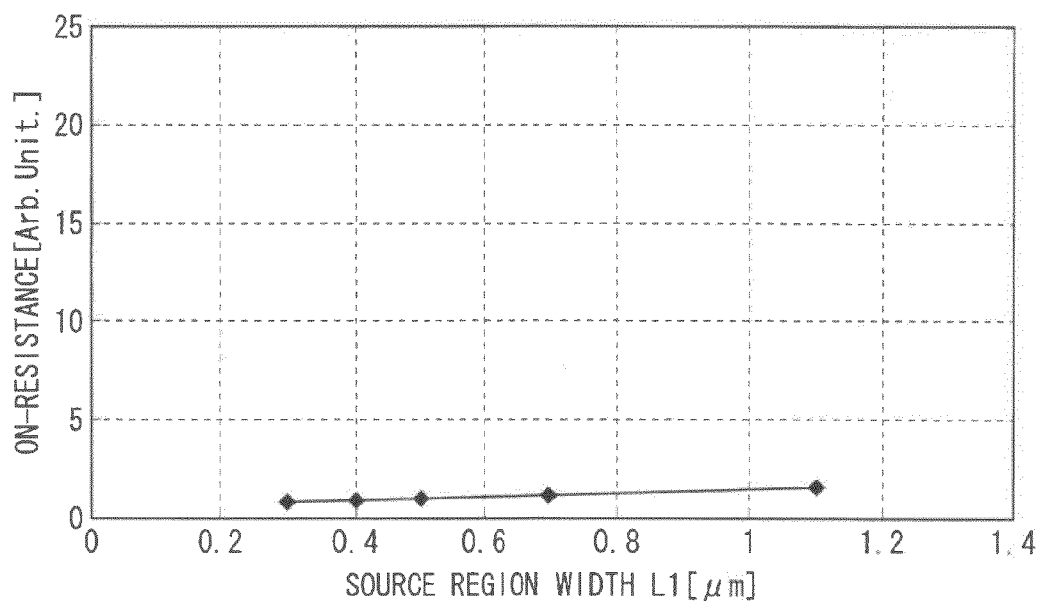

F I G. 6
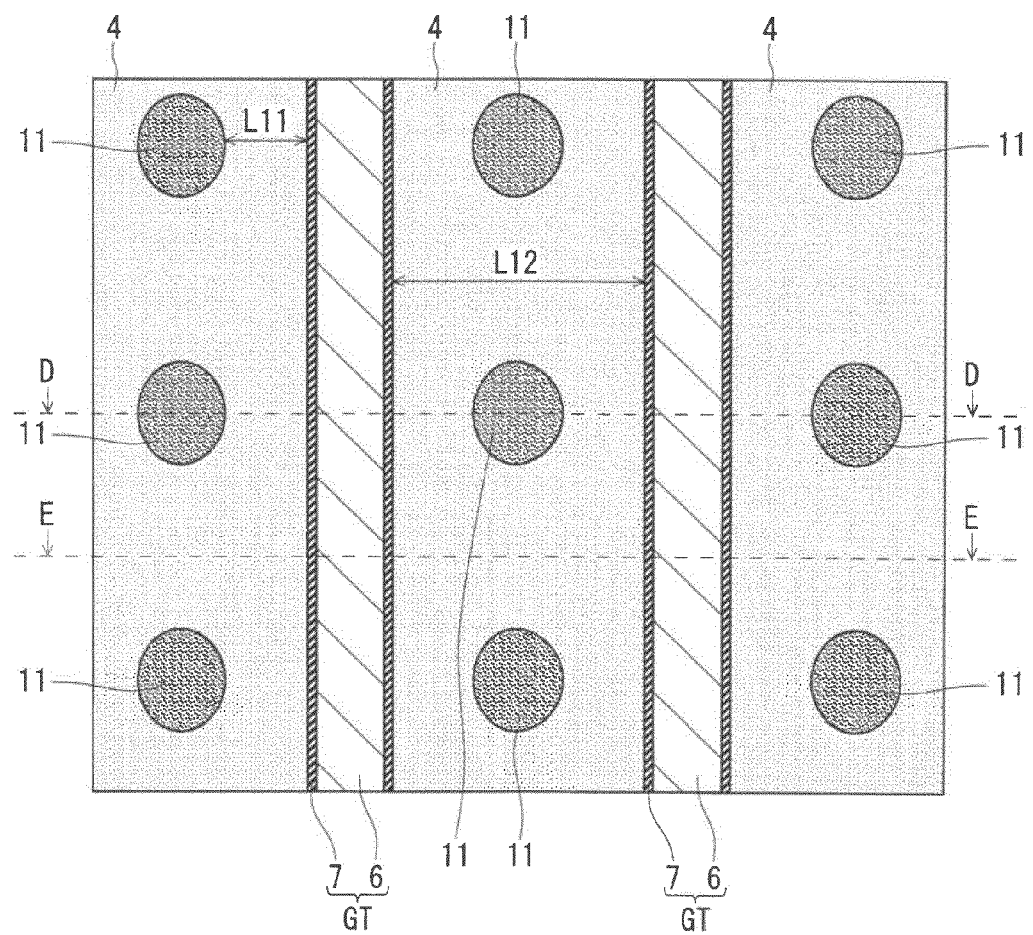

F I G. 7
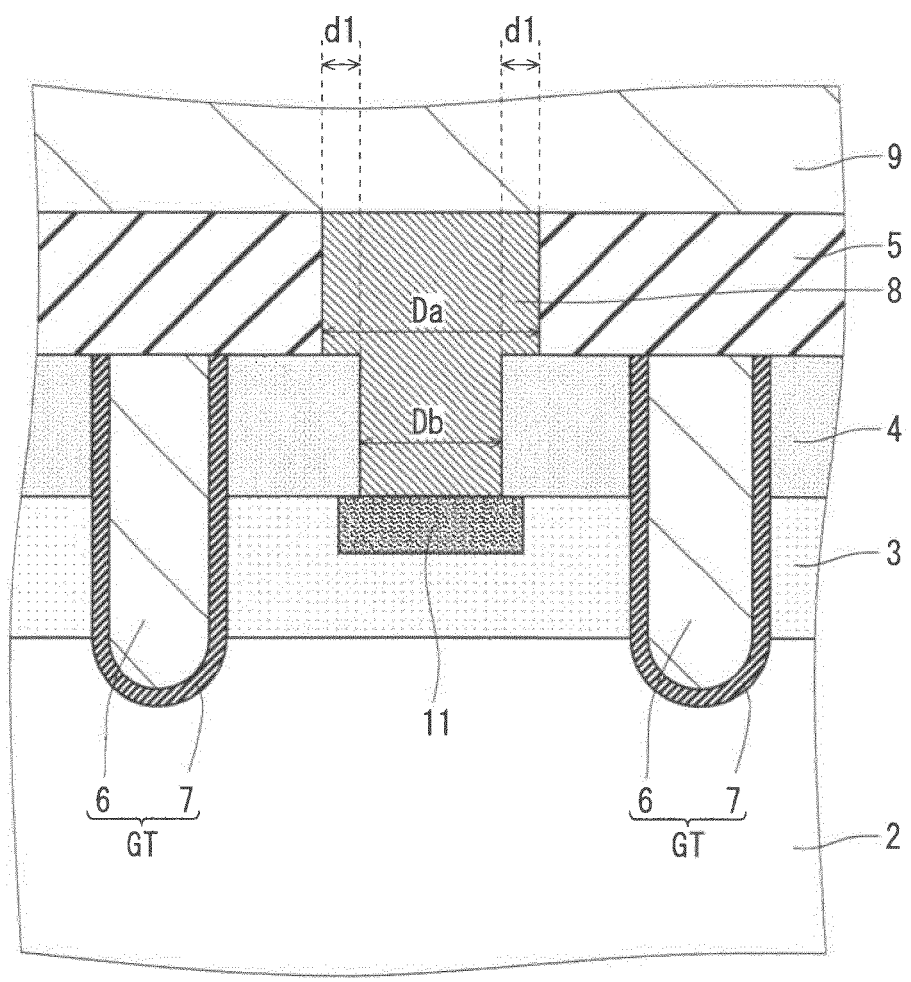

F I G. 8
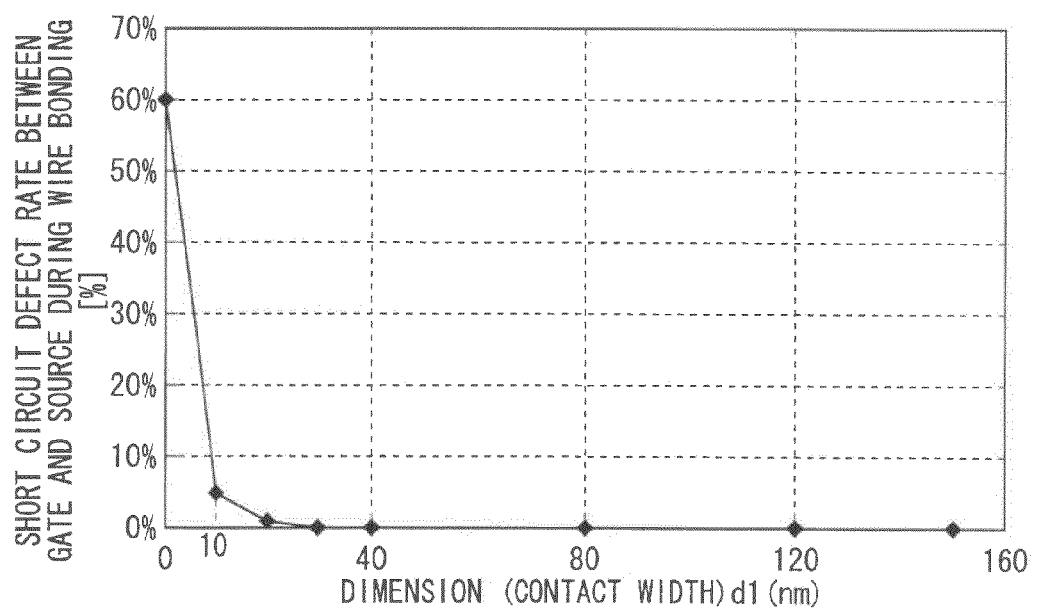

SEMICONDUCTOR DEVICE

BACKGROUND OF THE INVENTION

1. Field of the Invention

The present invention relates to a semiconductor device, and more particularly, to a power semiconductor device having a trench gate structure.

2. Description of the Background Art

As a semiconductor device used in switching elements of a power amplifier circuit, a power circuit and the like, for example, there is known a semiconductor device including a high-voltage element such as a power metal insulator semiconductor field effect transistor (MISFET). Further, as a power MISFET, so-called "vertical" and "horizontal" ones are known. In addition, as a "vertical" power MISFET, one having a so-called trench gate structure is known.

Here, MISFET refers to an insulated gate field effect transistor in which a gate insulating film is interposed between a channel forming region (semiconductor) and a gate electrode. Note that a transistor in which a gate insulating film is formed of a silicon oxide film is typically referred to as a metal oxide semiconductor field effect transistor (MOSFET).

One in which current flows in a thickness direction of a semiconductor substrate is a "vertical" transistor, whereas one in which current flows in a surface direction of a semiconductor substrate is a "lateral" transistor.

One in which a channel for electrons is formed in a channel forming region between a source region and a drain region is referred to as an "n-type" transistor, whereas one in which a channel for holes is formed therebetween is referred to as a "p-type" transistor.

The trench gate structure refers to a gate electrode structure in which a gate electrode is provided, via a gate insulating film, inside a channel provided on a main surface of a semiconductor substrate.

In MOSFETs having the trench gate structure, cells are miniaturized per generation (for example, see Japanese Patent Application Laid-Open No. 2001-15743). A channel region is increased per unit area by miniaturizing cells, which leads to a reduction in on-resistance. As a result, loss during conduction can be reduced.

In a case of an n-type MOSFET disclosed in Japanese Patent Application Laid-Open No. 2001-15743, a channel is not formed in a p+ region when an n+ source region and a p+ contact region are disposed in a stripe shape. Accordingly, there is a limitation on a reduction of on-resistance.

As the technology for solving the above-mentioned problem, there is, for example, the technology of Japanese Patent Application Laid-Open No. 2009-81323. In the technology of Japanese Patent Application Laid-Open No. 2009-81323, in addition to the trench gate structure, the contact portion also has a trench structure (herein, referred to as trench contact structure). This leads to an increase in channel density per unit area in accordance with the same design rule, and hence a reduction in on-resistance is achieved.

In a semiconductor device having the trench gate structure and the trench contact structure, it is required that cells be miniaturized further while maintaining a low on-resistance. In a semiconductor device having the trench gate structure and the trench contact structure, in some cases, an electrical short circuit occurs between a gate and a source as a result of wire bonding of a source electrode. Therefore, it is desired that cells be miniaturized further while suppressing an electrical short circuit that occurs between a gate and a source.

SUMMARY OF THE INVENTION

An object of the present invention is to provide a semiconductor device having a trench gate structure and a trench contact structure, which is capable of making a cell size as small as possible while keeping a low on-resistance.

Another object of the present invention is to provide a semiconductor device having a trench gate structure and a trench contact structure, which is capable of making a cell size as small as possible while suppressing the generation of an electrical short circuit between a gate and a source.

According to a first aspect of the present invention, a semiconductor device includes a base layer, a source layer, an insulating film, a gate structure, a conductive portion and a source electrode. The base layer has a first conductivity type. The source layer is formed on the base layer and has a second conductivity type. The insulating film is formed on the source layer. The gate structure includes a plurality of gate structures, each thereof penetrating the base layer. The conductive portion includes a plurality of conductive portions, each thereof penetrating the insulating film and the source layer and electrically connected to the source layer and the base layer. The source electrode is formed on the insulating film and is electrically connected to the conductive portions.

Further, the gate structures are formed in a stripe shape in plan view. Parts in which the conductive portion is connected to the base layer are formed, in plan view, with a distance from the gate structure between the gate structures so as to be parallel to a direction of the stripe shape of the gate structures. In addition, a dimension of a part in which the source layer and the base layer are in contact with each other between the gate structure and the conductive portion is 0.36 µm or more and 0.43 µm or less.

Accordingly, it is possible to provide a semiconductor device having the trench gate structure, which is capable of making a cell size as small as possible while keeping a low on-resistance.

According to a second aspect of the present invention, a semiconductor device includes a base layer, a source layer, an insulating film, a gate structure, a conductive portion and a source electrode. The base layer has a first conductivity type. The source layer is formed on the base layer and has a second conductivity type. The insulating film is formed on the source layer. The gate structure includes a plurality of gate structures, each thereof penetrating the base layer. The conductive portion includes a plurality of conductive portions, each thereof penetrating the insulating film and the source layer and electrically connected to the source layer and the base layer. The source electrode is formed on the insulating film and is electrically connected to the conductive portions.

Further, the gate structures are formed in a stripe shape in plan view. Parts in which the conductive portion is connected to the base layer are formed, in plan view, side by side in an island shape in a direction of the stripe shape of the gate structures with a distance from the gate structure between the gate structures. In addition, a dimension of a part in which the source layer and the base layer are in contact with each other between the gate structures in a region in which the conductive portion is not connected to the base layer is 0.36 µm or more.

Accordingly, it is possible to provide a semiconductor device having the trench gate structure, which is capable of making a cell size as small as possible while keeping a low on-resistance.

According to a third aspect of the present invention, a semiconductor device includes a base layer, a source layer, an insulating film, a gate structure, a conductive portion and a source electrode. The base layer has a first conductivity type. The source layer is formed on the base layer and has a second conductivity type. The insulating film is formed on the source layer. The gate structure includes a plurality of gate structures, each thereof penetrating the base layer. The conductive portion penetrates the insulating film and the source layer, is in contact with an upper surface of the source layer, and is electrically connected to the source layer and the base layer. The source electrode is formed on the insulating film and is electrically connected to the conductive portion.

Further, a dimension of a part in which the upper surface of the source layer and the conductive portion are in contact with each other is 10 nm or more and 40 nm or less.

Accordingly, part of the stress generated in wire bonding for the source electrode is absorbed by the upper surface of the source layer that is in contact with the conductive portion. Therefore, it is possible to provide a semiconductor device capable of making a cell size as small as possible while suppressing a short circuit between a gate and a source.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view showing a configuration of a semiconductor device according to the present invention;

FIG. 3 is a graph for describing effects of the semiconductor device according to the first preferred embodiment;

FIG. 5 is a graph for describing effects of the semiconductor device according to the second preferred embodiment;

FIG. 6 is a plan view showing a configuration of a semiconductor device according to a third preferred embodiment;

FIG. 7 is an enlarged cross-sectional view showing a configuration of a semiconductor device according to a fourth preferred embodiment; and FIG. 8 is a graph for describing effects of the semiconductor device according to the fourth preferred embodiment.

DESCRIPTION OF THE PREFERRED EMBODIMENTS

Figure 2:
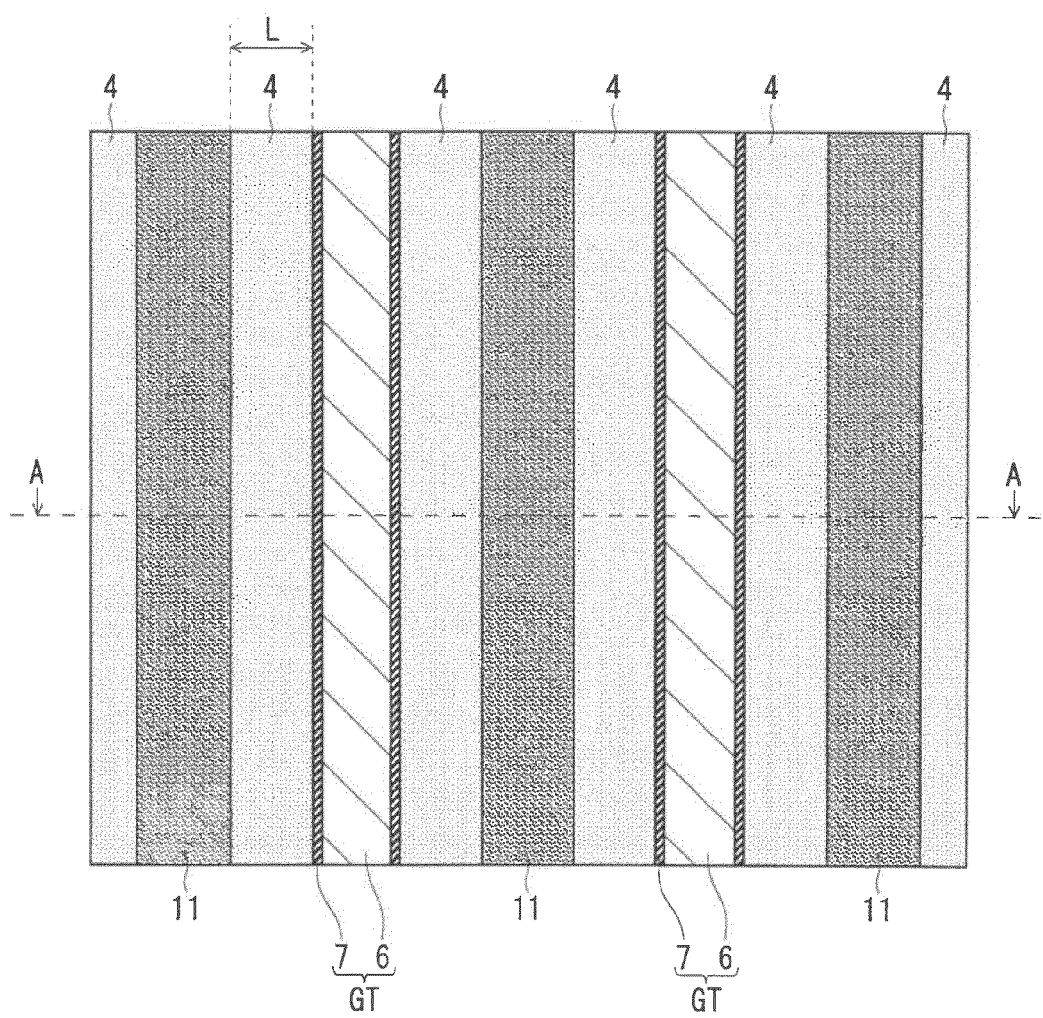
FIG. 2 is a plan view showing a configuration of a semiconductor device according to a first preferred embodiment.

The present invention is specifically described below in connection with preferred embodiments thereof with reference to the drawings.

First Preferred Embodiment

FIG. 1 shows a cross-sectional structure of a semiconductor device according to a first preferred embodiment.

In the description below, an "n+ type" refers to the same conductivity type as an "n type", which means higher impurity concentration than that of the "n type". An "n– type" refers to the same conductivity type as an "n type", which means lower impurity concentration than that of the "n type". Further, a "p+ type" refers to the same conductivity type as a "p type", which means higher impurity concentration than that of the "p type". Note that a "p– type" is not mentioned in the description below, and thus description of the "p– type" is omitted.

As shown in FIG. 1, the semiconductor device according to this preferred embodiment includes a semiconductor substrate 1, an epitaxial layer 2, a base layer 3, a source layer 4, an insulating film 5, a gate electrode 6, a gate insulating film 7, conductive portions 8, a source electrode 9 and a drain electrode 10.

The semiconductor substrate 1 is an n+ type and functions as a drain region. The drain electrode 10 is formed under a lower surface of the semiconductor substrate 1. On the other hand, on an upper surface of the semiconductor substrate 1, the epitaxial layer (that is taken as a drift layer) 2 is formed by epitaxial growth. The epitaxial layer 2 is an n– type. Formed on the epitaxial layer 2 is a trench gate type MISFET (or MOSFET).

Specifically, the base layer 3 is formed on the epitaxial layer 2. In this case, the base layer 3 is a p type. Formed on the base layer 3 is the source layer 4. In this case, the source layer 4 is an n+ type. Further, there are formed a plurality of trench gate structures GT that penetrate the source layer 4 and the base layer 3.

The trench gate structure GT is formed by the following steps. First, a plurality of trenches penetrating the source layer 4 and the base layer 3 are formed by photolithography and etching. Then, the gate insulating film 7 is formed inside the trench, and the gate electrode 6 of polysilicon or the like is formed on the gate insulating film 7. As a result, as shown in FIG. 1, the trench gate structure GT is formed so as to fill the trench. That is, the gate electrode 6 is in contact with a lateral surface of the base layer 3 and a lateral surface of the source layer 4 via the gate insulating film 7. Note that a bottom of the trench gate structure GT reaches a top of the epitaxial layer 2.

Further, the insulating film 5 is formed on the source layer 4. A plurality of conductive portions 8 that penetrate the insulating film 5 and the source layer 4 are formed. In this case, as shown in a cross-sectional view of FIG. 1, a width of the conductive portion 8 in the insulating film 5 is larger than a width of the conductive portion 8 in the source layer 4. Therefore, part of the conductive portion 8 is in contact with an upper surface of the source layer 4.

A bottom surface of the conductive portion 8 is electrically connected to an upper surface of the base layer 3 (more specifically, contact region 11 of p+ type formed on a surface of the base layer 3). That is, the trench contact structure is formed. Here, as commonly known, the contact region 11 is formed as part of the structure of the base layer 3 for reducing an electrical contact resistance between the conductive portion 8 and the base layer 3. In addition, as shown in FIG. 7, a lateral surface of the conductive portion 8 is electrically connected to the source layer 4 as well.

The conductive portion 8 (trench contact structure) is formed by the following steps. First, a plurality of trenches that penetrate the insulating film 5 and the source layer 4 are formed by photolithography and etching. Then, a laminate structure of conductors is filled into the trench. As a result, as shown in FIG. 1, the conductive part 8 is formed so as to fill the trench (that is, trench contact structure is formed). Note that examples of the conductors constituting the laminate structure include aluminum, titanium, titanium nitride and tungsten.

The source electrode 9 is formed on the insulating film 5. That is, the insulating film 5 is provided so that the source electrode 9 and the gate electrode 6 are electrically insulated. Here, a lower surface of the source electrode 9 and an upper surface of the conductive portion 8 are electrically connected to each other. Accordingly, the source electrode 9 is electrically connected to the upper surface of the base layer 3 and the lateral surface of the source layer 4 via the conductive portions 8.

FIG. 2 is a plan view showing the configuration of the semiconductor device according to this preferred embodiment. Specifically, FIG. 2 is a view of the semiconductor device shown in FIG. 1 that is viewed from above, and in terms of simplification of the view, the source electrode 9, the insulating film 5 and the conductive portions 8 are not shown. Note that an A-A cross section of FIG. 2 corresponds to the cross-sectional view of FIG. 1.

As shown in FIG. 2, in plan view, the trench gate structures GT are formed in a stripe shape. It is understood from FIG. 2 that the trench gate structures GT are extended in a front-back direction of FIG. 1.

Further, as shown in FIG. 2, in plan view, parts (contact regions 11) in which the conductive portion 8 and the base layer 3 are in contact with each other are formed in a stripe shape. Here, the part (contact region 11) in which the conductive portion 8 and the base layer 3 are in contact with each other is formed with a predetermined distance from the trench gate structure GT in a left-right direction of FIG. 2. In addition, a direction of the stripe of the parts (contact regions 11) in which the conductive portion 8 and the base layer 3 are connected to each other is parallel to a direction of the stripe of the trench gate structures GT. Further, in the left-right direction of FIG. 2, formed between the trench gate structures GT is the part (contact region 11) in which one conductive part 8 and the base layer 3 are connected to each other.

Therefore, in plan view, along the left-right direction of FIG. 2, the stripe-shaped trench gate structure GT, the stripe-shaped source layer 4, the stripe-shaped part (contact region 11) in which the conductive portion 8 and the base layer 3 are connected to each other, the stripe-shaped source layer 4 and the stripe-shaped trench gate structure GT are periodically formed in the stated order.

Parts in which the contact regions 11 are shown in FIG. 2 are parts of the base layer 3 that are not in contact with the source layer 4 (that is, parts of the base layer 3 that are in contact with the conductive portion 8). In contrast, parts in which the source layer 4 is shown in FIG. 2 are the parts in which the source layer 4 and the base layer 3 are in contact with each other.

In the semiconductor device according to this preferred embodiment, a dimension of a source region width L is 0.36 μm or more. Here, the source region width L refers to a width of one line-shape source layer 4, that is, a width of one source layer 4 in the left-right direction of FIG. 2, which refers to a dimension of the part in which the source layer 4 and the base layer 3 are in contact with each other, between the trench gate structure GT and the conductive part 8 (contact region 11) in the left-right direction of FIG. 2.

As described above, in this preferred embodiment, the dimension of the source region width L is 0.36 μm or more. Therefore, it is possible to improve channel density by miniaturizing cells of a semiconductor device, which achieves a low on-resistance.

FIG. 3 shows data of the relationship between the source region width L and the on-resistance of the semiconductor device. Here, a horizontal axis and a vertical axis of FIG. 3 represent the source region width L (μm) and an on-resistance value (in arbitrary unit) of the transistor cell.

As shown in FIG. 3, a low on-resistance is achieved when the source region width L is 0.36 μm or more, whereas the on-resistance steeply rises by approriately ten times when the source region width L is smaller than 0.36 μm. The reason why the on-resistance steeply rises when the source region width L is smaller than 0.36 μm is that a supply amount of electrons from the source layer 4 to the base layer 3 decreases when the source region width L is reduced. In other words, supply of electrons from the source layer 4 to the base layer 3 is secured when the source region width L is 0.36 μm or more.

The data of FIG. 3 reveals that, within a range of a magnitude allowable for the on-resistance, the source region width L for enabling the source region width L to be small as possible is 0.4 μm or more and 0.43 μm or less. In the range, as shown in FIG. 3, a rise of the on-resistance is within an allowable range though the on-resistance increases slightly. Note that a low on-resistance is maintained even when a source region width L larger than 0.43 μm is used, which is contrary to the demand for miniaturizing a device.

Note that when the source region width L is made to be 0.36 μm in the configurations shown in FIGS. 1 and 2, it is possible to provide a semiconductor device having a minimum transistor cell size while maintaining a low on-resistance.

Second Preferred Embodiment

Figure 4:
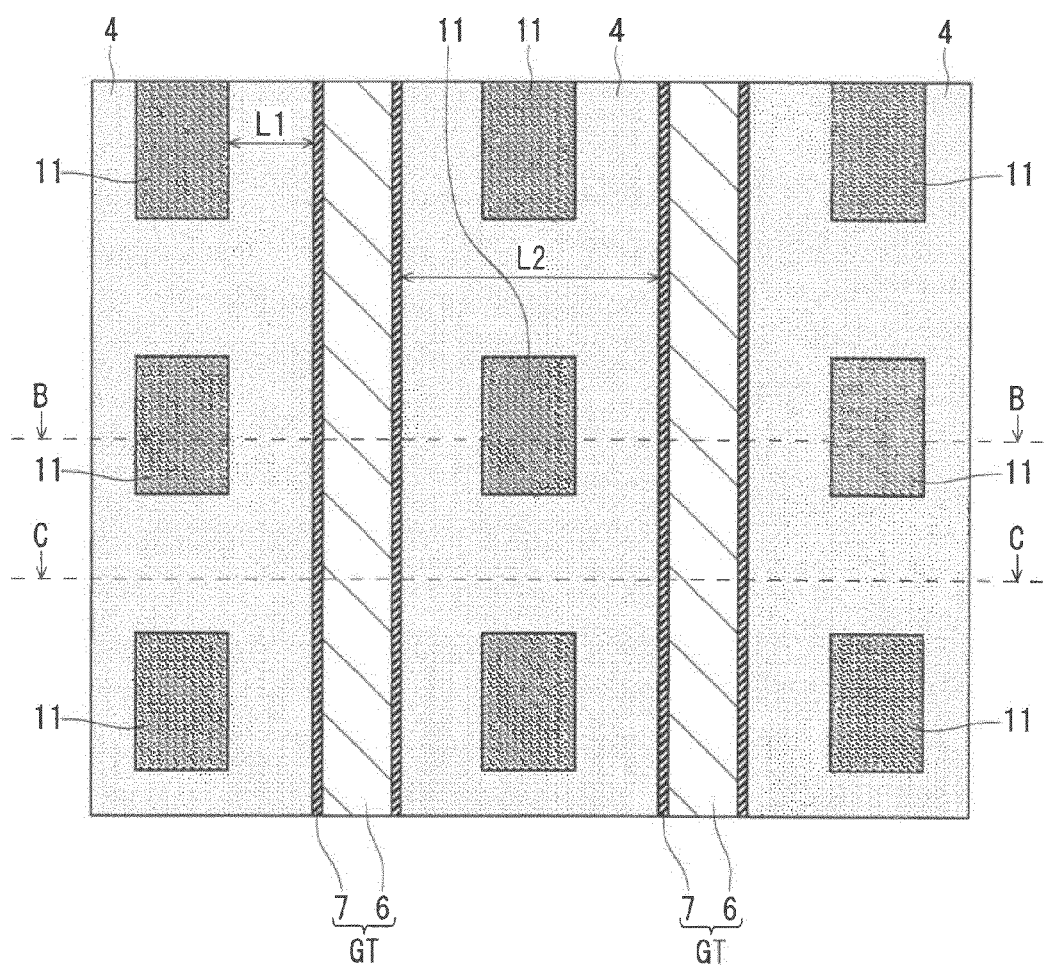
FIG. 4 is a plan view showing a configuration of a semiconductor device according to a second preferred embodiment.

FIG. 4 is a plan view showing a configuration of a semiconductor device according to this preferred embodiment. Specifically, FIG. 4 is a view of the semiconductor device shown in FIG. 1 that is viewed from above. From the viewpoint of simplification of the view, the source electrode 9, the insulating film 5 and the conductive portion 8 are not shown. Note that a B-B cross section of FIG. 4 corresponds to the cross-sectional view of FIG. 1. Note that the first preferred embodiment is to be referred to for the description of the cross-sectional structure of FIG. 1.

As apparent from the comparison between FIGS. 2 and 4, there is a difference in plan-view structure between the semiconductor device according to the first preferred embodiment and the semiconductor device according to the second preferred embodiment. Those preferred embodiments are different from each other in the part in which the conductive portion 8 and the base layer 3 are connected to each other.

In the configuration shown in FIG. 4, in plan view, the trench gate structures GT are formed in a stripe shape. It is understood from FIG. 4 that the trench gate structures GT are extended in the front-back direction of FIG. 1.

Further, as shown in FIG. 4, in plan view, the parts (contact regions 11) in which the conductive portion 8 and the base layer 3 are connected to each other are formed in an isolated island shape. Here, the part (contact region 11) in which the conductive portion 8 and the base layer 3 are connected to each other is formed to be apart from the trench gate structure GT by a predetermined distance in the left-right direction of FIG. 4. Moreover, the parts (contact regions 11) in which the conductive portion 8 and the base layer 3 are connected to each other are formed side by side to be apart from each other by a predetermined distance along the stripe direction of the trench gate structures GT. That is, in the left-right direction of FIG. 4, between the trench gate structures GT, there are a plurality of parts (contact regions 11) in which the conductive portion 8 and the base layer 3 are connected to each other, which are arranged along the stripe direction.

Accordingly, in plan view, the stripe-shaped trench gate structure GT, the source layer 4, the part (contact region 11) in which the conductive portion 8 and the base layer 3 are connected to each other, the source layer 4 and the stripe-shaped trench gate structure GT are periodically formed in the stated order along the B-B section line of FIG. 4. In contrast, in plan view, the stripe-shaped trench gate structure GT, the source layer 4 and the stripe-shaped trench gate structure GT are periodically formed in the stated order along the C-C line of FIG. 4.

In FIG. 4, the parts in which the contact region 11 is shown are parts of the base layer 3 that are not in contact with the source layer 4 (that is, parts of the base layer 3 that are in contact with the conductive portion 8). In contrast, in FIG. 4, the parts in which the source layer 4 is shown are parts in which the source layer 4 and the base layer 3 are in contact with each other.

Note that in this preferred embodiment, the part in which the conductive portion 8 and the base layer 3 are connected to each other has a rectangular shape in plan view. Here, FIG. 4 shows an example of a rectangular shape in plan view.

As is apparent from the above, there are two types of source region widths L1 and L2 in the semiconductor device according to this preferred embodiment. Here, noticing one source layer 4 from the left-right direction of FIG. 4, the source region width L1 represents a dimension of a part in which the source layer 4 and the base layer 3 are in contact with each other, between the trench gate structure GT and the conductive part 8 (contact region 11). On the other hand, noticing one source layer 4 from the left-right direction of FIG. 4, the source region width L2 represents the width of the source layer 4 between the trench gate structures GT. That is, the source region width L2 represents a dimension of the part in which the source layer 4 and the base layer 3 are in contact with each other between the trench gate structures GT in the region in which the conductive part 8 is not connected to the base layer 3.

In the semiconductor device according to this preferred embodiment, the dimension of the source region width L2 is 0.36 μm or more.

As described above, in this preferred embodiment, the dimension of the source region width L2 is 0.36 μm or more. Therefore, even if the source region width L1 is smaller than 0.36 μm, the source region width L2 keeps 0.36 μm or more. Accordingly, it is possible to improve channel density by miniaturizing cells of the semiconductor device, which enables a low on-resistance. In other words, the source region width L2 keeps 0.36 μm or more even in a case where the channel region width L1 is smaller than 0.36 μm, whereby a steep rise in on-resistance shown in FIG. 3 can be avoided.

FIG. 5 shows data of the relationship between the source region width L1 and the on-resistance of the semiconductor device. Here, a horizontal axis and a vertical axis of FIG. 5 represent the source region width L1 (μm) and an on-resistance value (in arbitrary unit) of the transistor cell. According to the data of FIG. 5, the source region width L2 is 0.36 μm or more.

As shown in FIG. 5, as long as the source region width L2 is kept at 0.36 μm or more, even when the source region width L1 becomes smaller than 0.36 μm, a low on-resistance is achieved, which prevents the on-resistance from rising steeply. Note that though data in which the source region width L1 is from 0.3 μm to 1.1 μm is shown in FIG. 5, a low on-resistance is maintained even when the source region width L1 becomes smaller than 0.3 μm.

As described above, the reason why a low on-resistance is maintained even when the source region width L1 is smaller than 0.36 μm is that supply of electrons from the source layer 4 to the base layer 3 can be secured because the source region width L2 is 0.36 μm or more.

By setting the source region width L2 to 0.36 μm in the configurations shown in FIGS. 1 and 4, it is possible to provide a semiconductor device whose transistor cell has a minimum size while maintaining a low on-resistance.

Third Preferred Embodiment

FIG. 6 is a plan view showing a configuration of a semiconductor device according to this preferred embodiment. Specifically, FIG. 6 is a view of the semiconductor device shown in FIG. 1 that is viewed from above. From the viewpoint of simplification of the view, the source electrode 9, the insulating film 5 and the conductive portion 8 are not shown. Note that a D-D cross section of FIG. 6 corresponds to the cross-sectional view of FIG. 1. Note that the first preferred embodiment is to be referred to for the description of the cross-sectional structure of FIG. 1.

As apparent from the comparison between FIGS. 4 and 6, the semiconductor device according to the second preferred embodiment and the semiconductor device according to the third preferred embodiment are different from each other in plan-view shape of each part in which the conductive portion 8 and the base layer 3 are connected to each other, each part existing in an island shape.

Specifically, in the second preferred embodiment, each part in which the conductive portion 8 and the base layer 3 are connected to each other has a rectangular shape in plan view (a rectangular shape is illustrated in FIG. 4). In contrast, in the third preferred embodiment, each part in which the conductive portion 8 and the base layer 3 are connected to each other has a circular or oval shape (an oval shape is illustrated in FIG. 6).

In the configuration shown in FIG. 6, in plan view, the trench gate structures GT are formed in a stripe shape. It is understood from FIG. 6 that the trench gate structures GT are extended in the front-back direction of FIG. 1.

Further, as shown in FIG. 6, in plan view, the parts (contact regions 11) in which the conductive portion 8 and the base layer 3 are connected to each other are formed in an isolated island shape. Here, the part (contact region 11) in which the conductive portion 8 and the base layer 3 are connected to each other is formed to be apart from the trench gate structure GT by a predetermined distance in the left-right direction of FIG. 6. Moreover, the parts (contact regions 11) in which the conductive portion 8 and the base layer 3 are connected to each other are formed side by side to be apart from each other by a predetermined distance along the stripe direction of the trench gate structures GT. That is, in the left-right direction of FIG. 6, between the trench gate structures GT, there are a plurality of parts (contact regions 11) in which the conductive portion 8 and the base layer 3 are connected to each other, which are arranged along the stripe direction.

Accordingly, in plan view, the stripe-shaped trench gate structure GT, the source layer 4, the part (contact region 11) in which the conductive portion 8 and the base layer are connected to each other, the source layer 4 and the stripe-shaped trench gate structure GT are periodically formed in the stated order along the D-D section line of FIG. 6. In contrast, in plan view, the stripe-shaped trench gate structure GT, the source layer 4 and the stripe-shaped trench gate structure GT are periodically formed in the stated order along the E-E line of FIG. 6.

In FIG. 6, the parts in which the contact region 11 is shown are parts of the base layer 3 that are not in contact with the source layer 4 (that is, parts of the base layer 3 that are in contact with the conductive portion 8). In contrast, in FIG. 6, the parts in which the source layer 4 is shown are parts in which the source layer 4 and the base layer 3 are in contact with each other.

Note that the part in which the conductive portion 8 and the base layer 3 are connected to each other has a circular or oval shape in plan view. Here, FIG. 6 shows an example of an oval shape in plan view.

As is apparent from the above, there are at least two types of source region widths L11 and L12 in the semiconductor device according to this preferred embodiment. Here, noticing one source layer 4 from the left-right direction of FIG. 6, the source region width L11 represents a minimum dimension of the part in which the source layer 4 and the base layer 3 are in contact with each other between the trench gate structure GT and the conductive part 8 (contact region 11). On the other hand, noticing one source layer 4 from the left-right direction of FIG. 6, the source region width L12 represents the width of the source layer 4 between the trench gate structures GT. That is, the source region width L12 represents a dimension of the part in which the source layer 4 and the base layer 3 are in contact with each other between the trench gate structures GT in the region in which the conductive part 8 is not connected to the base layer 3.

In the semiconductor device according to this preferred embodiment, the dimension of the source region width L12 is 0.36 μm or more.

As described above, in this preferred embodiment, the dimension of the source region width L12 is 0.36 μm or more. Therefore, similar effects to those described in the second preferred embodiment are achieved. That is, even if the source region width L11 is smaller than 0.36 μm, the source region width L12 keeps 0.36 μm or more. Accordingly, it is possible to improve channel density by miniaturizing cells of the semiconductor device, which enables a low on-resistance. In other words, the source region width L12 keeps 0.36 μm or more even in a case where the source region width L11 is smaller than 0.36 μm, whereby a steep rise in on-resistance shown in FIG. 3 can be avoided.

As described above, the reason why a low on-resistance is maintained even when the source region width L11 becomes smaller than 0.36 μm is that supply of electrons from the source layer 4 to the base layer 3 can be secured because the source region width L12 is 0.36 μm or more.

Note that by setting the source region width L12 to 0.36 μm in the configurations shown in FIGS. 1 and 6, it is possible to provide a semiconductor device whose transistor cell has a minimum size while maintaining a low on-resistance.

Incidentally, in forming the conductive part 8, there is formed a contact hole into which a conductive material constituting the conductive portion 8 is filled. Photolithography and etching are performed in forming the contact hole.

Here, as described in this preferred embodiment, the contact between the conductive portion 8 and the base layer 3 is caused to have a circular or oval shape in plan view. As a result, even when a pattern is miniaturized, it is possible to improve a process margin in the photolithography and etching.

Fourth Preferred Embodiment

FIG. 7 is an enlarged cross-sectional view of a semiconductor device according to this preferred embodiment. FIG. 7 is an enlarged cross-sectional view showing a configuration in the vicinity of the conductive portion 8 of FIG. 1. The cross-sectional configuration of FIG. 1 is as described in the first preferred embodiment. That is, the semiconductor device according to this preferred embodiment also has the trench gate structure and trench contact structure, as shown in FIG. 1.

Note that with reference to FIG. 7, a direction extending from one trench gate structure to another trench gate structure is referred to as a "horizontal direction" in this preferred embodiment. That is, the left-right direction of FIG. 7 is referred to as the "horizontal direction" in this preferred embodiment.

As shown in FIG. 7, the conductive portion 8 is formed so as to penetrate the insulating film 5 and the source layer 4.

Here, the conductive portion 8 is a member for electrically connecting the source electrode 9, the source layer 4 and the base layer 3, as described in the first preferred embodiment. In this preferred embodiment, the conductive portion 8 has two types of widths Da and Db in the horizontal direction. The width Db of the conductive portion 8 in the horizontal direction that is located within the source layer 4 is smaller than the width Da of the conductive portion 8 in the horizontal direction that is located within the insulating film 5 (Db<Da).

Accordingly, as shown in FIG. 7, the conductive portion 8 is in contact with part of the upper surface of the source layer 4. That is, the part of the conductive portion 8, which is obtained by subtracting the width Db from the width Da, is in contact with the upper surface of the source layer 4.

Here, in this preferred embodiment, the part in which the upper surface of the source layer 4 and the conductive portion 8 are in contact with each other has a dimension of 10 nm or more. That is, dimensions d1 shown in FIG. 7 are 10 nm or more.

The configuration of FIG. 7 can be made by the following steps. First, a through hole is formed in the insulating film 5 and the source layer 4. Then, in order to increase the width in a horizontal direction of the through hole within the insulating film 5, etching is performed only on the insulating film 5 using, for example, hydrofluoric acid. As a result, a through hole having two types of widths is formed in the insulating film 5 and the source layer 4. Here, the through hole in the insulating film 5 has a larger width than the through hole in the source layer 4. After that, a conductive material is filled into the through hole having two types of widths. In this manner, the conductive portion 8 having two types of widths Da and Db is formed so as to penetrate the insulating film 5 and the source layer 4.

As described above, in this preferred embodiment, part of the conductive portion 8 is in contact with the upper surface of the source layer 4, and the dimension d1 of the contact portion is 10 nm or more. That is, the contact width between the source layer 4 and the conductive portion 8 is secured for 10 nm or more.

As a result, the stress that is generated in wire bonding for the source electrode 9 is absorbed by the upper surface of the source layer 4 that is in contact with the conductive portion 8. Therefore, it is possible to reduce a short circuit between a gate and a source.

The above-mentioned effects are specifically described with reference to FIG. 8.

FIG. 8 is a graph showing the dimension (contact width) d1 of the part in which the upper surface of the source layer 4 and the conductive portion 8 are in contact with each other, and a defect rate of a short circuit between a gate and a source during wire bonding. A horizontal axis of FIG. 8 represents the dimension (contact width) d1 (nm). On the other hand, a vertical axis of FIG. 8 represents a defect rate (%) due to a short circuit between a gate and a source that occurs during wire bonding for the source electrode 9.

As apparent from FIG. 8, in a case where the dimension (contact width) d1 is 10 nm or more, the defect rate is small, 5% or less, whereas the defect rate rises steeply when the dimension (contact width) d1 becomes less than 10 nm. In a case where the upper surface of the source layer 4 and the conductive portion 8 are not in contact with each other at all, that is, in a case where the width in the horizontal direction of the conductive portion 8 within the source layer 4 is the same as the width in the horizontal direction of the conductive portion 8 within the insulating film 5 (in a case where d1=0), the defect rate reaches 60%.

The reason why the defect rate rises steeply as described above is that in a case where the dimension (contact width) d1 is less than 10 nm, the stress that is generated in wire bonding for the source electrode 9 tends to be concentrated on the base layer 3 (specifically, contact region 11) which is the bottom of the conductive portion 8. The concentration of stress causes deformation of the configuration in the vicinity of the contact part between the base layer 3 and the conductive portion 8, and the deformation causes an electrical short circuit between the source electrode 9 and the gate electrode 6 via the conductive portion 8 and the like.

On the other hand, in a case where the dimension (contact width) d1 is 10 nm or more, the stress that is generated in wire bonding is dispersed also to the upper surface of the source layer 4, and the stress exerted on the base layer 3 (contact region 11) is mitigated. The stress exerted on the base layer 3 is mitigated, which suppresses the deformation. As a result, as shown in FIG. 8, the defect rate due to a short between a gate and a source can be reduced considerably.

The data of FIG. 8 reveals that the dimension (contact width) d1 for making the dimension (contact width) d1 as small as possible within an allowable defect rate due to a short circuit between a gate and a source is 10 nm or more and 40 nm or less. As shown in FIG. 8, though the defect rate due to a short circuit between a gate and a source increases slightly within this range, an increase of the defect rate is in an allowable range. Note that even when the dimension (contact width) d1 more than 40 nm is employed, the defect rate due to a short circuit between a gate and a source is made to be 0%, which is contrary to the demand for miniaturizing a device.

Note that when the dimension (contact width) d1 is set to 10 nm in the configurations shown in FIGS. 1 and 7, it is possible to provide a semiconductor device whose transistor cell has a minimum size while suppressing the defect rate of a short circuit between a gate and a source.

Further, the configuration in which the dimension d1 is 10 nm or more that is described in this preferred embodiment and the configurations in which the source region widths L and L2 are 0.36 μm or more that are described in the first, second and third preferred embodiments may be combined together. Alternatively, only the configuration according to this preferred embodiment may be applied to the structures shown in FIGS. 1 and 7.

Here, the structures shown in FIGS. 1 and 7 refer to the structures in which the base layer 3, the source layer 4, the insulating film 5 and the source electrode 9 are laminated in the stated order, in which the conductive portion 8 is formed so as to penetrate the insulating film 5 and the source layer 4. Note that the conductive portion 8 electrically connects the base layer 3 and the source layer 4 to the source electrode 9. In the horizontal direction, the conductive portion 8 is located between one trench gate structure GT and another trench gate structure GT. That is, the structures shown in FIGS. 1 and 7 refer to the configuration that has the trench gate structure and the trench contact structure, in which the source region width is not particularly limited.

In each of the first to fourth preferred embodiments described above, the conductivity type of each of the semiconductor substrate 1, the epitaxial layer 2 and the source layer 4 is an n type, while the conductivity type of each of the base layer 3 and the contact region 11 is an p type. However, the conductivity type of each of the semiconductor substrate 1, the epitaxial layer 2 and the source layer 4 may be a p type, while the conductivity type of each of the base layer 3 and the contact region 11 may be an n type. Note that in such a case, the conductivity type of the semiconductor substrate 1 is a p+ type, the conductivity type of the epitaxial layer 2 is a p− type, the conductivity type of the source layer 4 is a p+ type, the conductivity type of the base layer 3 is an n type, and the conductivity type of the contact region 11 is an n+ type.

Further, in each of the first to fourth preferred embodiments described above, the semiconductor substrate 1, the epitaxial layer 2, the base layer 3 (including the contact region 11) and the source layer 4 are formed of semiconductor materials (in particular, silicon or silicon carbide).

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
    a base layer having a first conductivity type;
    a source layer formed on said base layer and having a second conductivity type;
    an insulating film formed on said source layer;
    a plurality of gate structures penetrating said base layer;
    a plurality of conductive portions penetrating said insulating film and said source layer and electrically connected to said source layer and said base layer; and
    a source electrode formed on said insulating film and electrically connected to said conductive portions, wherein:
    said gate structures are formed in a stripe shape in plan view;
    parts in which said conductive portions are connected to said base layer are formed, in plan view, with a distance from said gate structures between said gate structures so as to be parallel to a direction of said stripe shape of said gate structures; and
    a dimension of a part in which said source layer and said base layer are in contact with each other between said gate structures and said conductive portions are 0.36 μm or more and 0.43 μm or less.

2. The semiconductor device according to claim 1, wherein:
    said conductive portions penetrate said insulating film and said source layer while being in contact with an upper surface of said source layer; and
    a dimension of a part in which the upper surface of said source layer and said conductive parts are in contact with each other is 10 nm or more and 40 nm or less.

3. The semiconductor device according to claim 1, wherein said source layer and said base layer include silicon or silicon carbide.

4. A semiconductor device, comprising:
    a base layer having a first conductivity type;
    a source layer formed on said base layer and having a second conductivity type;
    an insulating film formed on said source layer;
    a plurality of gate structures penetrating said base layer;
    a plurality of conductive portions penetrating said insulating film and said source layer and electrically connected to said source layer and said base layer; and
    a source electrode formed on said insulating film and electrically connected to said conductive portions, wherein:
    said gate structures are formed in a stripe shape in plan view;
    parts in which said conductive portions are connected to said base layer are formed, in plan view, side by side in an island shape in a direction of said stripe shape of said gate structures with a distance from said gate structures between said gate structures; and a dimension of a part in which said source layer and said base layer are in contact with each other between said gate structures in a region in which said conductive portions are not connected to said base layer is 0.36 µm or more.

5. The semiconductor device according to claim 4, wherein:

said conductive parts penetrate said insulating film and said source layer while being in contact with an upper surface of said source layer; and a dimension of a part in which the upper surface of said source layer and said conductive portions are in contact with each other is 10 nm or more and 40 nm or less.

6. The semiconductor device according to claim 4, wherein the part in which said conductive portion is connected to said base layer has a circular shape or an oval shape in plan view.

7. The semiconductor device according to claim 4, wherein said source layer and said base layer include silicon or silicon carbide.

8. A semiconductor device, comprising:

a base layer having a first conductivity type;

a source layer formed on said base layer and having a second conductivity type;

an insulating film formed on said source layer;

a plurality of gate structures penetrating said base layer;

a conductive portion penetrating said insulating film and said source layer, being in contact with an upper surface of said source layer, and electrically connected to said source layer and said base layer; and a source electrode formed on said insulating film and electrically connected to said conductive portion, wherein a dimension of a part in which the upper surface of said source layer and said conductive portion are in contact with each other is 10 nm or more and 40 nm or less.

9. The semiconductor device according to claim 8, wherein said source layer and said base layer include silicon or silicon carbide.

* * * * *